(12) United States Patent
Yeh et al.

(10) Patent No.: US 6,200,870 B1
(45) Date of Patent: Mar. 13, 2001

(54) METHOD FOR FORMING GATE

(75) Inventors: Wen-Kuan Yeh, Chupei; Tony Lin, Kao Hsiung Hsien; Jih-Wen Chou, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/189,355

(22) Filed: Nov. 9, 1998

(51) Int. Cl.$^7$ .................................. H01L 21/336
(52) U.S. Cl. .................. 438/302; 438/766; 438/510; 438/305
(58) Field of Search .......................... 438/510, 525, 438/528, 766, 775, 305, 303, 302

(56) References Cited

U.S. PATENT DOCUMENTS 5,576,228 * 11/1996 Chen et al. ........................ 438/302

FOREIGN PATENT DOCUMENTS

09321157 * 8/1998 (JP).

* cited by examiner

*Primary Examiner*—Charles Bowers
*Assistant Examiner*—Yennhu B. Huynh
(74) *Attorney, Agent, or Firm*—Oppenheimer Wolff & Donnelly LLP

(57) ABSTRACT

A method for forming a gate that improves the quality of the gate includes sequentially forming a gate oxide layer, a polysilicon layer, a conductive layer and a masking layer on a substrate. Thereafter, the masking layer, the conductive layer, the polysilicon layer and the gate oxide layer are patterned to form the gate. Then, a passivation layer, for increasing the thermal stability and the chemical stability of the gate, is formed on the sidewall of the conductive layer by ion implantation with nitrogen cations. The nitrogen cations are doped into the substrate, under the gate oxide layer, by ion implantation, which can improve the penetration of the phosphorus ions.

9 Claims, 3 Drawing Sheets

METHOD FOR FORMING GATE

BACKGROUND OF THE INVENTION

1. Field of Invention

The present invention relates to a method for fabricating a semiconductor device. More particularly, the present invention relates to a method for forming a gate that improves the quality of the gate.

2. Description of Related Art

An embedded dynamic random access memory (DRAM) is an integrated circuit (IC) device combines a memory cell array and a logical circuit array in a single chip. The embedded DRAM, which improves the use of IC by accessing data with high speed, can be used as the logical circuit for processing data, in systems such as a graphics processor.

Conventionally, the material of the silicide layer, which is in the gate of the memory cell array, is tungsten silicide. Tungsten silicide is not suitable for the silicide layer in processes where the critical dimension is under 0.25 micron, because the resistivity of tungsten silicide is higher than titanium silicide. Processes in which the critical dimension is under 0.25 micron use titanium silicide as the material of the silicide layer formed by a self-aligned silicide (salicide) process.

FIGS. 1A–1D are cross-sectional views of a semiconductor device schematically illustrating a conventional fabrication process for forming a gate in a metal oxide semiconductor (MOS) transistor.

In FIG. 1A, isolation structures 12 are formed in a substrate 10. Then, a gate oxide layer 14 is formed on the substrate 10 by a thermal oxidation process, such as dry oxidation, wherein the substrate 10 is placed in a furnace for thermal oxidation. After the oxidation step, a polysilicon layer 16 is formed on the gate oxide layer 14 by low pressure chemical vapor deposition (LPCVD). In order to decrease the resistance of the polysilicon layer 16, boric ions are doped into the polysilicon layer 16 by an ion implantation process.

In FIG. 1B, the polysilicon layer 16 and the gate oxide layer 14 are patterned to form a gate 18. A lightly doped drain (LDD) process is performed after patterning. Then, a spacer 20 is formed on the sidewall of the gate 18, and a heavily doping step is performed to form the source and drain 22.

In FIG. 1C, a titanium metal layer 21 is formed on the gate 18 and the substrate 10 by magnetron DC sputtering deposition, wherein the thickness of the metal layer 21 is about 200 Å to 1000 Å.

In FIG. 1D, the part of the titanium metal layer 21 that lies over the source and drain 22 and the gate 18 reacts with the silicon in the source and drain 22 and the polysilicon in the gate 18 at high temperature, to form titanium silicide. The conductive layer 24 of titanium silicide is formed on the source and drain 22 and the gate 18 by removing the other part of the titanium metal layer 21 via wet etching.

There are some problems in the MOS transistor formed by the conventional method according to the prior art. First, the resistance of the gate increases because the titanium silicide layer in the gate reacts easily with oxygen in the air at room temperature to form titanium dioxide. Second, the titanium silicide layer, formed by a self-aligned silicide process and containing an incomplete reaction product, causes instability in resistance of the titanium silicide layer. Third, the metallic impurities released from the silicide layer pollute the process equipment, wherein the metallic impurities are generated by the subsequent thermal treatment process or wet etching. Fourth, boric ions in the polysilicon layer diffuse into other devices by interconnect formed on the gate to affect the operation of these devices. Fifth, boric ions from the polysilicon layer readily penetrate into the gate oxide layer to reach the substrate, which causes the threshold voltage to decrease and the MOS transistor to operate unstably.

In light of the foregoing, there is a need to provide a method for forming a gate that improves the quality of semiconductor devices.

SUMMARY OF THE INVENTION

Accordingly the present invention is to provide a method for forming a gate that improves the quality of the gate, wherein the oxidation of the silicide layer and the diffusion of the metallic impurities are prevented in order to improve the quality of MOS transistors.

To achieve these and other advantages and in accordance with the purpose of the invention, as embodied and broadly described herein, the invention provides a method for forming a gate that improves the quality of the gate. The method includes sequentially forming a gate oxide layer, a polysilicon layer, a conductive layer and a masking layer on a substrate, and patterning the masking layer, the conductive layer, the polysilicon layer and the gate oxide layer to form the gate. Then, a passivation layer is formed on the sidewall of the conductive layer by the ion implantation, wherein nitrogen cations are doped into the substrate at an angle between the direction of the ion implantation and the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
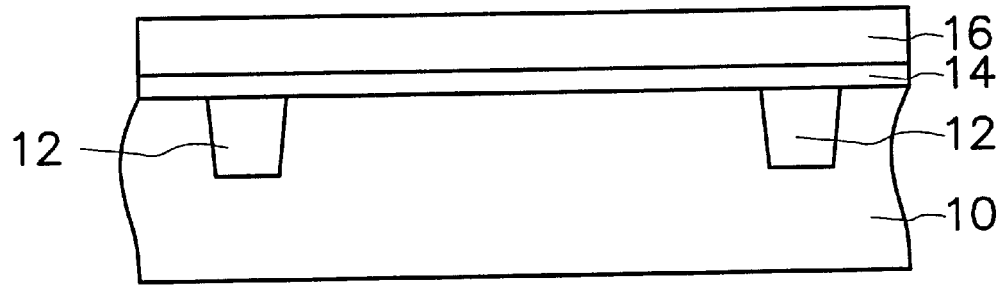
FIGS. 1A–1D are cross-sectional views of a semiconductor device schematically illustrating a conventional fabrication process for forming a gate in a metal oxide semiconductor (MOS) transistor.
Figure 1B:
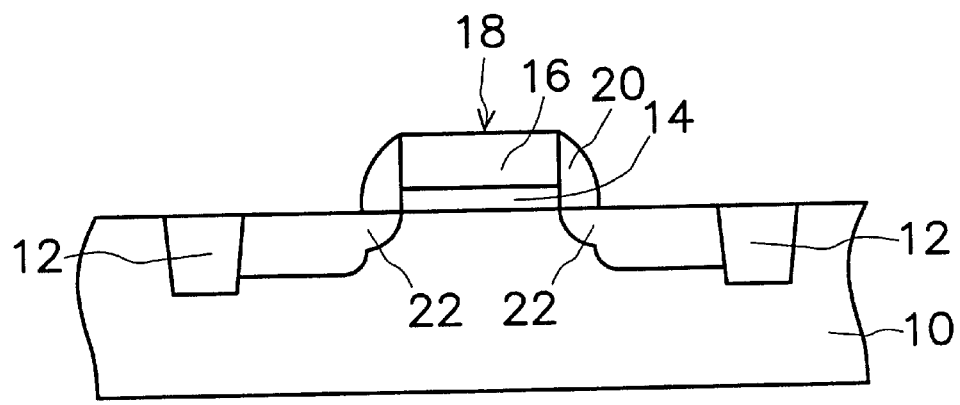
Figure 1C:
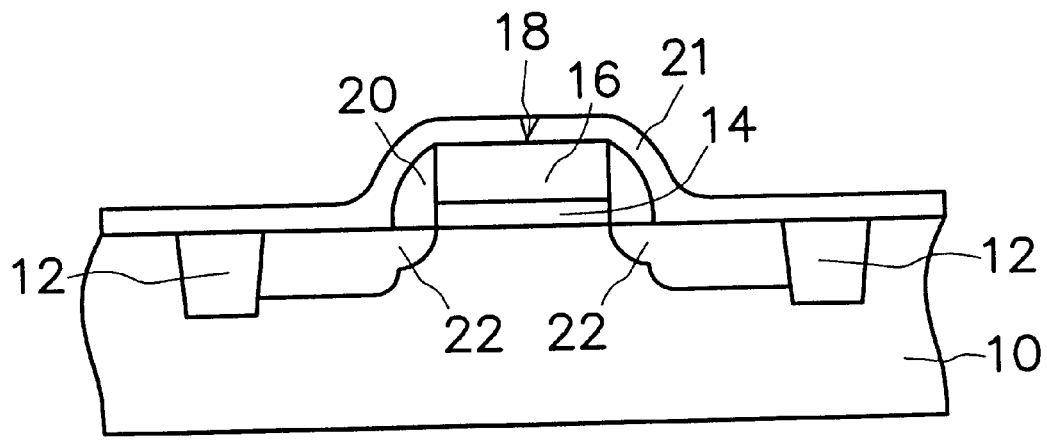
Figure 1D:
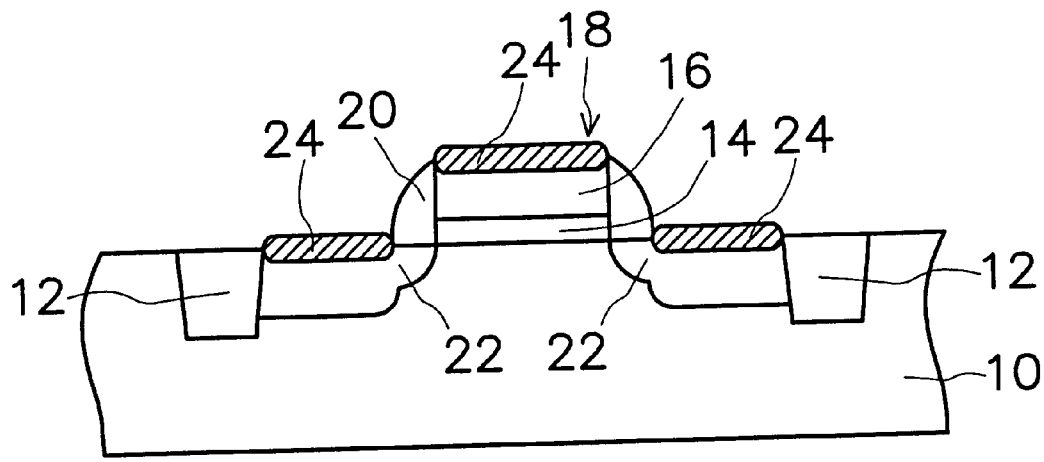

Reference will now be made in detail to the present preferred embodiments of the invention, examples of which are illustrated in the accompanying drawings. Wherever possible, the same reference numbers are used in the drawings and the description to refer to the same or like parts.

Figure 2A:
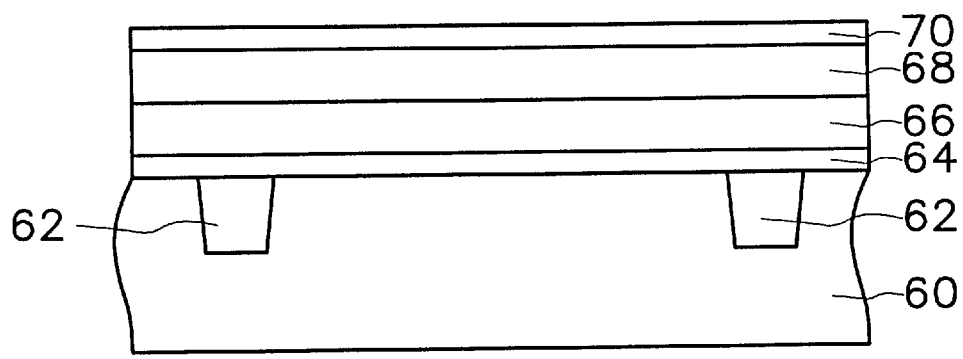
FIGS. 2A–2C are cross-sectional views of a semiconductor device schematically illustrating a fabrication process for forming a gate in a MOS transistor, according to a preferred embodiment of the present invention.
Figure 2B:
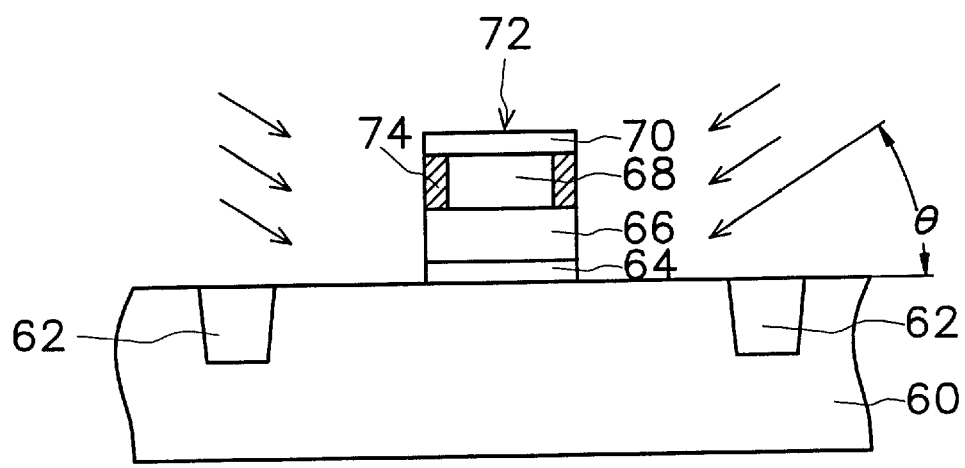
Figure 2C:
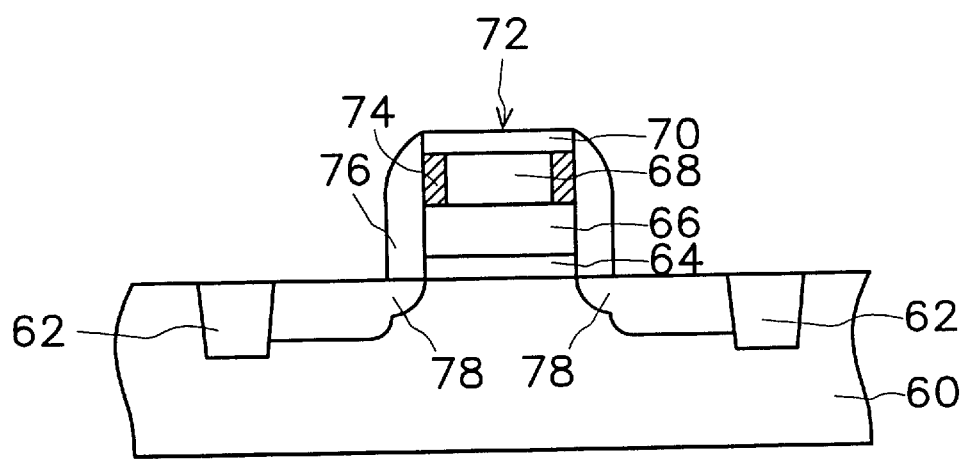

FIGS. 2A–2C are cross-sectional views of a semiconductor device schematically illustrating a fabrication process for forming a gate in a metal oxide semiconductor (MOS) transistor that improves the quality of semiconductor devices, according to a preferred embodiment of the present invention.

Referring to FIG. 2A, isolation structures 62, which include shallow trenches, are formed in a substrate 60. Then, the surface of the substrate 60 is cleaned by rinsing with an organic solvent, for example. After cleaning, a gate oxide layer 64, of the thickness about 100 Å to 200 Å, is formed over the substrate 60 by, for example, dry oxidation, wherein the substrate 60 is placed in a furnace for a thermal oxidation process. A polysilicon layer 66, of the thickness about 2000 Å to 3000 Å, is subsequently formed over the gate oxide layer 64 by, for example, chemical vapor deposition (CVD). To decrease the resistance of the polysilicon layer 66, p-type ions, such as boric ions, are doped into the polysilicon layer 66 by, for example, ion implantation. Thereafter, a conductive layer 68 is formed over the polysilicon layer 66 by, for example, physical vapor deposition (PVD), wherein the preferred material of the conductive layer 68 includes silicide, such as titanium silicide ($TiSi_x$). Next, a masking layer 70 is formed over the conductive layer 68 by, for instance, plasma enhanced chemical vapor deposition (PECVD), wherein the preferred material of the masking layer includes silicon nitride.

Referring to FIG. 2B, the masking layer 70, the conductive layer 68, the polysilicon layer 66 and the gate oxide layer 64 are patterned in the region between the neighboring isolation structures 62 to form a gate 72. After patterning, ion implantation of nitrogen cations ($N_2^+$) is performed to form a passivation layer 74 on the sidewall of the conductive layer 68. The substrate 60 under the gate 72 is doped with nitrogen cations, as well. The energy for implantation is about 5KeV to 20KeV and the dosage of implantation is about $10^{14}/cm^2$ to $10^{15}/cm^2$, wherein the direction of the ion implantation is at an angle θ of about 5° to 60° relative to the surface of the substrate 60.

Referring to FIG. 2C, the fabrication of a MOS transistor can be completed by the following conventional procedures such as lightly doping, spacer forming, heavily doping and source/drain forming. The step of lightly doping is performed by a conventional method. Next, a spacer 76 is formed on the sidewall around the gate 72. Using the gate 72 and the spacer 76 as a mask, heavily doping is performed to form the source and drain 78 in the substrate 60. Then, the fabrication of a MOS transistor is completed.

According to the preferred embodiment of the present invention, the present invention has advantages such as:

1. After the step of ion implantation with nitrogen cations, the passivation layer, formed on the sidewall of the conductive layer, prevents the further oxidation of the conductive layer, wherein the further oxidation would increase the resistance of the gate. The passivation layer also prevents the contamination of the process equipment by metallic impurities released from the conductive layer, wherein the metallic impurities are generated by the subsequent thermal treatment process or wet etching.

2. After nitrogen cations are doped into the substrate under the gate, the ion implantation process prevents boric ions in the polysilicon layer from diffusing into the substrate via the gate oxide layer.

3. The purity of the silicide, formed by sputtering deposition, is better than conventionally formed silicide, which can improve the conductivity of the gate.

4. The MOS transistor has a more stable threshold voltage when it is doped with nitrogen cations.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a gate, comprising the steps of:

forming a gate oxide layer over a substrate, wherein isolation structures are formed on the substrate;

forming a polysilicon layer over the gate oxide layer;

forming a conductive layer over the polysilicon layer;

forming a masking layer over the conductive layer;

patterning the masking layer, the conductive layer, the polysilicon layer and the gate oxide layer to form the gate; and performing an ion implantation process at an angle to form a passivation layer on a sidewall of the conductive layer and to implant ions into a region of the substrate, wherein the angle is between the direction of the ion implantation and the substrate, the passivation layer reducing oxidation of the conductive layer, the implanted region of the substrate reducing diffusion from the polysilicon layer into the substrate through the gate oxide layer.

2. The method of claim 1, wherein the isolation structures include shallow trenches.

3. The method of claim 1, wherein the step of forming the polysilicon layer includes chemical vapor deposition.

4. The method of claim 1, wherein after the step of forming the polysilicon layer, the method further comprises an ion implantation of p-type ions.

5. The method of claim 1, wherein the step of forming the conductive layer includes physical vapor deposition.

6. The method of claim 1, wherein the conductive layer includes a silicide layer.

7. The method of claim 1, wherein the passivation layer includes a silicon nitride layer.

8. The method of claim 1, wherein the angle between the direction of the ion implantation and the substrate is about 5° to 60°.

9. The method of claim 1, wherein after the step of ion implantation, the method further comprises:

forming a spacer on a sidewall of the gate; and forming a source and a drain in the substrate while using the gate and the spacer as a mask.

* * * * *